(12) United States Patent
Sato et al.

(10) Patent No.: US 11,419,211 B2
(45) Date of Patent: Aug. 16, 2022

(54) CIRCUIT MODULE AND MANUFACTURING METHOD FOR CIRCUIT MODULE

(71) Applicant: Murata Manufacturing Co., Ltd., Kyoto (JP)

(72) Inventors: Kazushige Sato, Kyoto (JP); Jun Kashirajima, Kyoto (JP); Yuya Eshita, Kyoto (JP); Nobumitsu Amachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 121 days.

(21) Appl. No.: 16/537,700

(22) Filed: Aug. 12, 2019

(65) Prior Publication Data

US 2019/0364660 A1   Nov. 28, 2019

(30) Foreign Application Priority Data

Feb. 17, 2017   (JP) .............................. JP2017-028308

(51) Int. Cl.
  *H05K 1/11* (2006.01)
  *H05K 1/09* (2006.01)
  (Continued)

(52) U.S. Cl.
  CPC ............... *H05K 1/11* (2013.01); *H05K 1/097* (2013.01); *H05K 1/182* (2013.01); *H05K 3/30* (2013.01);
  (Continued)

(58) Field of Classification Search
  CPC .......... H05K 1/11; H05K 1/097; H05K 1/182; H05K 3/30; H05K 3/40; H05K 3/4644;
  (Continued)

(56) References Cited

U.S. PATENT DOCUMENTS 5,072,075 A * 12/1991 Lee .................. H05K 1/162
                                                  174/264
6,734,542 B2 * 5/2004 Nakatani ............. H01L 21/4857
                                                  257/687
(Continued)

FOREIGN PATENT DOCUMENTS

JP    2009-289866 A    12/2009
JP    2009289866    *  12/2009
(Continued)

OTHER PUBLICATIONS

International Search Report for International Application No. PCT/JP2017/045889 dated Mar. 13, 2018.

(Continued)

*Primary Examiner* — Pete T Lee
(74) *Attorney, Agent, or Firm* — Pearne & Gordon LLP (57) ABSTRACT

A circuit module (100) includes a substrate (1), on one principal surface of which a first wiring pattern (2) is provided, first electronic components (3-6) constituting a first electronic circuit together with the first wiring pattern (2), a plurality of connection conductors (8), a plurality of external connection terminals, a first resin layer (9), and a second resin layer (12). At least one of the plurality of connection conductors (8) includes a first columnar conductor (8a) extending in a normal line direction of the one principal surface of the substrate (1), and a plate-like conductor (8b) extending in a direction parallel to the one principal surface of the substrate (1). At least one of the plurality of external connection terminals is a second columnar conductor (11) extending in the normal line direction of the one principal surface of the substrate (1).

11 Claims, 5 Drawing Sheets

(51) Int. Cl.
*H05K 1/18* (2006.01)
*H05K 3/30* (2006.01)
*H05K 3/40* (2006.01)
*H05K 3/46* (2006.01)

(52) U.S. Cl.
CPC .............. *H05K 3/40* (2013.01); *H05K 3/4644* (2013.01); *H05K 2201/0257* (2013.01); *H05K 2203/013* (2013.01)

(58) Field of Classification Search
CPC ...... H05K 2201/0257; H05K 2203/013; H01L 23/293; H01L 23/3121; H01L 2224/16225; H01L 21/56; H01L 23/12; H01L 25/04; H01L 25/18; H01L 2924/19105
See application file for complete search history.

(56) References Cited

U.S. PATENT DOCUMENTS

| | | | | |
|---|---|---|---|---|
| 7,548,430 | B1* | 6/2009 | Huemoeller | H01L 21/4857 361/760 |
| 9,391,043 | B2* | 7/2016 | Paek | H01L 24/05 |
| 9,960,328 | B2* | 5/2018 | Clark | H01L 24/00 |
| 2002/0061642 | A1* | 5/2002 | Haji | H01L 24/12 438/613 |
| 2004/0063246 | A1* | 4/2004 | Karnezos | H01L 23/552 438/108 |
| 2004/0145044 | A1* | 7/2004 | Sugaya | H01L 24/29 257/698 |
| 2004/0159462 | A1* | 8/2004 | Chung | H01L 23/4985 174/259 |
| 2014/0182918 | A1* | 7/2014 | Ogawa | H01L 23/3121 174/262 |
| 2014/0185248 | A1 | 7/2014 | Mizushiro | |
| 2015/0056426 | A1* | 2/2015 | Grouchko | H01B 13/003 428/208 |
| 2018/0070440 | A1* | 3/2018 | Hanya | H05K 3/1283 |

FOREIGN PATENT DOCUMENTS

| | | |
|---|---|---|
| JP | 2011-243922 A | 12/2011 |
| JP | 2014-110337 A | 6/2014 |
| WO | 2013/035655 A1 | 3/2013 |
| WO | 2013/035714 A1 | 3/2013 |

OTHER PUBLICATIONS

Written Opinion for International Application No. PCT/JP2017/045889 dated Mar. 13, 2018.

* cited by examiner

--PRIOR ART--

CIRCUIT MODULE AND MANUFACTURING METHOD FOR CIRCUIT MODULE

This is a continuation of International Application No. PCT/JP2017/045889 filed on Dec. 21, 2017 which claims priority from Japanese Patent Application No. 2017-028308 filed on Feb. 17, 2017. The contents of these applications are incorporated herein by reference in their entireties.

BACKGROUND OF THE DISCLOSURE

Field of the Disclosure

The present disclosure relates to a circuit module including a substrate, an electronic component connected to the substrate to constitute an electronic circuit, an external connection terminal, a connection conductor for connecting the electronic circuit and the external connection terminal, and a resin layer.

Description of the Related Art

Circuit modules including a substrate, an electronic component connected to the substrate to constitute an electronic circuit, a metal column connected to the substrate, and a resin layer are already known. As an example of such circuit modules, a circuit module disclosed in International Publication No. WO 2013/035714 (Patent Document 1) (corresponding to Japanese Patent No. 5768888) can be cited.

Figure 6:
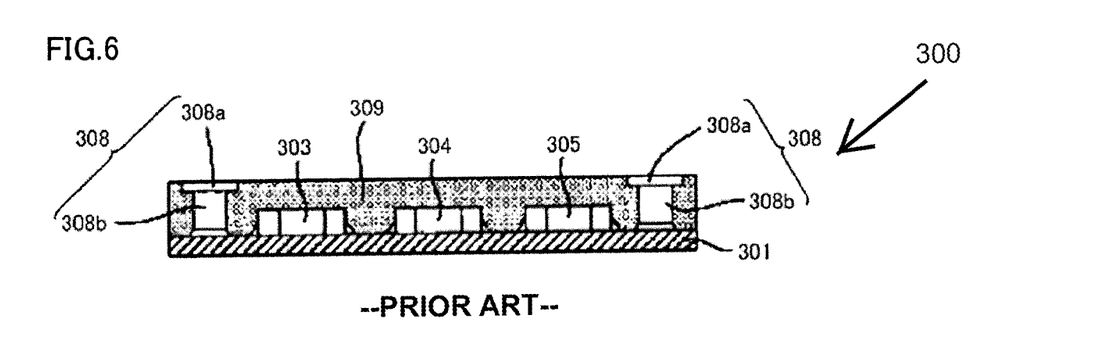
FIG. 6 is a cross-sectional view of a circuit module of background art.

FIG. 6 is a cross-sectional view of a circuit module 300 described in Patent Document 1. As illustrated in FIG. 6, the circuit module 300 includes a substrate 301, electronic components 303 to 305 constituting an electronic circuit, a metal column 308, and a resin layer 309. The metal column 308 includes a shaft portion 308*b*, and a plate-like portion 308*a* connected to one end of the shaft portion 308*b* and integrated with the shaft portion 308*b*. The electronic components 303 to 305 and the other end of the shaft portion 308*b* are connected to one principal surface of the substrate 301.

The electronic components 303 to 305 and the metal column 308 are embedded in the resin layer 309. Note that, however, the surface of the plate-like portion 308*a* opposing to the side connected to the shaft portion 308*b* is wider than an area of a cross section of the shaft portion 308*b* orthogonal to the extending direction thereof, and is exposed from the resin layer 309 so as to be flush with the outer surface of the resin layer 309. That is, the plate-like portion 308*a* serves as an external connection terminal in the circuit module 300. The shaft portion 308*b* serves as a connection conductor connecting the electronic circuit and the external connection terminal.

According to the circuit module 300 described in Patent Document 1, it is possible to miniaturize the circuit module 300 by the improvement in the arrangement density of the electronic components on the substrate 301, and to improve the connection reliability when connected to a mother substrate of an electronic apparatus.

Patent Document 1: International Publication No. WO 2013/035714

BRIEF SUMMARY OF THE DISCLOSURE

However, the metal column 308 in the circuit module 300 is a member such that the shaft portion 308*b* and the plate-like portion 308*a* are integrally manufactured as a so-called metal pin from the start of manufacturing. Because of this, the position of the external connection terminal of the circuit module 300 is limited to the position of the metal column 308 on the substrate 301. In other words, the degree of freedom in layout of the external connection terminal is low.

In Patent Document 1, the metal column 308 is connected to the substrate 301 in the following manner: the metal column 308 is temporarily pasted to a support body (not illustrate) to be erected thereon, and then the metal column 308 is transferred onto the substrate 301. That is, the shaft portion 308*b* is required to be thick enough to withstand the application of a load at the time of the transfer. Further, in order to reliably transfer the thin shaft portion 308*b* to a predetermined position, a device system to perform the transfer is required to have a significantly high positional-accuracy. The above requirements make it difficult to miniaturize the circuit module 300 as long as the circuit module 300 has the structure as described in Patent Document 1.

An object of the present disclosure is to provide a circuit module in which the degree of freedom in layout of an external connection terminal is high, and the miniaturization of which can be promoted.

In the present disclosure, the shape of an external connection terminal and the shape of a connection conductor connecting an electronic circuit and the external connection terminal are improved.

The present disclosure is directed first to a circuit module.

A circuit module according to the present disclosure includes a substrate, an electronic component, a plurality of connection conductors, a plurality of external connection terminals, and a resin layer. A first wiring pattern is provided on one principal surface of the substrate. The electronic component includes a first electronic component. The first electronic component is connected to the first wiring pattern to constitute a first electronic circuit together with the first wiring pattern. Each of the plurality of connection conductors connects the first electronic circuit and one of the plurality of external connection terminals. At least one of the plurality of connection conductors includes a first columnar conductor extending in a normal line direction of the one principal surface of the substrate, and a plate-like conductor extending in a direction parallel to the one principal surface of the substrate.

One end of the first columnar conductor is connected to the first wiring pattern or the first electronic component, and the other end of the first columnar conductor is connected to the plate-like conductor. At least one of the plurality of external connection terminals is a second columnar conductor extending in the normal line direction of the one principal surface of the substrate.

The resin layer includes a first resin layer disposed on the one principal surface of the substrate, and a second resin layer disposed on the first resin layer. The first electronic component and the first columnar conductor are embedded in the first resin layer. The plate-like conductor and the second columnar conductor are embedded in the second resin layer. A cross-sectional area of the first columnar conductor orthogonal to the normal line direction of the one principal surface of the substrate is smaller than a cross-sectional area of the second columnar conductor orthogonal to the normal line direction of the one principal surface of the substrate.

In the circuit module described above, the cross-sectional area of the first columnar conductor is smaller than the cross-sectional area of the second columnar conductor. Therefore, the arrangement density of the first electronic component and the first columnar conductor on the one principal surface of the substrate is high. In other words, the circuit module is miniaturized. In addition, since the cross-sectional area of the second columnar conductor is larger than the cross-sectional area of the first columnar conductor, the connection reliability when connected to a mother substrate of an electronic apparatus is also improved.

Further, in the circuit module described above, at least one of the connection conductors extending to the second columnar conductor serving as an external connection terminal includes the first columnar conductor extending in the normal line direction of the one principal surface of the substrate, and the plate-like conductor extending in a direction parallel to the one principal surface of the substrate. Therefore, in a case where one end of the second columnar conductor is connected to the plate-like conductor at a position where the first columnar conductor and the second columnar conductor do not share the same axis line, the degree of freedom in layout of the external connection terminal is high. The layout of the external connection terminal can be freely changed in accordance with the length of the plate-like conductor, the extending direction and the shape thereof, and the connection position of the second columnar conductor with respect to the plate-like conductor.

As a method for forming the first columnar conductor, for example, although a method in which a compact is produced by an ink jet method and thereafter the compact is sintered may be cited, the method is not limited thereto.

It is preferable for the circuit module according to the present disclosure to have the following features. That is, the plate-like conductor and the second columnar conductor are made of the same material and are formed as an integrated member.

In the circuit module described above, the plate-like conductor and the second columnar conductor are formed as an integrated member without generating a boundary surface by bonding different materials. Therefore, both of them are firmly connected to each other, and there is no increase in electric resistance due to the generation of a boundary surface. As a method for forming the plate-like conductor and the second columnar conductor as an integrated member, for example, a method in which a compact is produced by the ink jet method and thereafter the compact is sintered may be cited as described above. However, the method is not limited thereto.

It is desirable that a preferred embodiment of the circuit module according to the present disclosure have the following features. That is, the first columnar conductor, the plate-like conductor, and the second columnar conductor are made of the same material, and are formed as an integrated member. The first columnar conductor is directly connected to the first wiring pattern or the first electronic component.

In the circuit module described above, the first columnar conductor, the plate-like conductor, and the second columnar conductor are formed as an integrated member without generating a boundary surface by bonding different materials. In addition, the first columnar conductor is directly formed on the first wiring pattern or on the first electronic component without using solder, a conductive adhesive, or the like. In other words, the first wiring pattern or the first electronic component, the first columnar conductor, the plate-like conductor, and the second columnar conductor are firmly connected to each other.

With this, electric resistance from the first wiring pattern or the first electronic component to the second columnar conductor is suppressed to a low level. As a method in which the constituent elements mentioned above are formed as an integrated member and directly connected to the first wiring pattern or the first electronic component, although the above-discussed method in which a compact is produced by the ink jet method and thereafter the compact is sintered may be cited, the method is not limited thereto.

It is desirable that the circuit module and its preferred embodiment according to the present disclosure have the following features. That is, a second wiring pattern is provided on the other principal surface of the substrate. The electronic component further includes a second electronic component. The second electronic component is connected to the second wiring pattern to constitute a second electronic circuit together with the second wiring pattern. The resin layer further includes a third resin layer disposed on the other principal surface of the substrate. The second electronic component is embedded in the third resin layer.

In the circuit module described above, the second electronic circuit is constituted on the other principal surface side of the substrate, so that higher performance is achieved.

The present disclosure is also directed to a manufacturing method for a circuit module.

A manufacturing method for a circuit module according to the present disclosure is a manufacturing method for the circuit module including a substrate, an electronic component, a plurality of connection conductors, a plurality of external connection terminals, and a resin layer. A first wiring pattern is provided on one principal surface of the substrate. The electronic component includes a first electronic component.

At least one of the plurality of connection conductors includes a first columnar conductor extending in a normal line direction of the one principal surface of the substrate, and a plate-like conductor extending in a direction parallel to the one principal surface of the substrate. At least one of the plurality of external connection terminals is a second columnar conductor extending in the normal line direction of the one principal surface of the substrate. A cross-sectional area of the first columnar conductor orthogonal to the normal line direction of the one principal surface of the substrate is smaller than a cross-sectional area of the second columnar conductor orthogonal to the normal line direction of the one principal surface of the substrate. The resin layer includes a first resin layer and a second resin layer. The manufacturing method for the circuit module according to the present disclosure includes first processing to seventh processing as described below.

The first processing is processing in which the substrate and the electronic component including the first electronic component are prepared or produced. The second processing is processing in which the first electronic component is connected to the first wiring pattern to constitute a first electronic circuit together with the first wiring pattern. The third processing is processing in which the first columnar conductor is formed. The formation of the first columnar conductor is performed by firing a compact produced by an ink jet method using conductive ink containing metal nanoparticles. At this time, one end of the first columnar conductor is directly connected to the first wiring pattern or the first electronic component.

The fourth processing is processing in which the first wiring pattern, the first electronic component, and the first columnar conductor are embedded in the first resin layer. The first resin layer is formed on the one principal surface of the substrate. At this time, the other end of the first columnar conductor is exposed from a surface of the first resin layer. Here, "being embedded" is a technical concept that includes not only a state in which an object is entirely covered with the resin layer, but also a state in which most of the object is in the resin layer and the part thereof is exposed from the resin layer as described above.

The fifth processing is processing in which the plate-like conductor is formed on the surface of the first resin layer. The formation of the plate-like conductor is performed by firing a compact produced by the ink jet method using conductive ink containing metal nanoparticles. At this time, the plate-like conductor is connected to the other end of the first columnar conductor. The sixth processing is processing in which the second columnar conductor is formed. The formation of the second columnar conductor is performed by firing a compact produced by the ink jet method using conductive ink containing metal nanoparticles.

The seventh processing is processing in which the plate-like conductor and the second columnar conductor are embedded in the second resin layer. The second resin layer is formed on the surface of the first resin layer. At this time, the other end of the second columnar conductor is exposed from a surface of the second resin layer. Here, "being embedded" refers to the above-discussed concept.

In the manufacturing method for the circuit module, the first columnar conductor having a cross-sectional area smaller than that of the second columnar conductor is formed by the ink jet method. Accordingly, the arrangement density and the arrangement accuracy of the first electronic component and the first columnar conductor on the one principal surface of the substrate can be enhanced. This makes it possible to miniaturize the circuit module.

It is preferable that the manufacturing method for the circuit module according to the present disclosure have the following features. That is, a second wiring pattern is further provided on the other principal surface of the substrate. The electronic component further includes a second electronic component. The resin layer further includes a third resin layer.

The first processing in a preferred embodiment of the manufacturing method for the circuit module according to the present disclosure is processing in which the substrate, and the electronic component including the first electronic component and the second electronic component are prepared or produced. The preferred embodiment of the manufacturing method for the circuit module according to the present disclosure further includes eighth processing and ninth processing as described below.

The eighth processing is processing in which the second electronic component is connected to the second wiring pattern to constitute a second electronic circuit together with the second wiring pattern. The ninth processing is processing in which the second wiring pattern and the second electronic component are embedded in the third resin layer. The third resin layer is formed on the other principal surface of the substrate. Here, "being embedded" refers to the above-discussed concept.

In the manufacturing method for the circuit module described above, the second electronic circuit is constituted on the other principal surface side of the substrate, thereby making it possible to manufacture the circuit module having higher performance.

In the circuit module according to the present disclosure, the arrangement of the second columnar conductor can be freely changed in accordance with the length, the extending direction, and the shape of the plate-like conductor. In other words, the degree of freedom in layout of the external connection terminal is high. Further, the arrangement density of the first electronic component and the first columnar conductor on the one principal surface of the substrate is high. In other words, the circuit module is miniaturized.

DETAILED DESCRIPTION OF THE DISCLOSURE

Hereinafter, embodiments of the present disclosure will be described so as to give more detailed explanation on the features of the present disclosure. Although examples of a circuit module to which the present disclosure is applied include a communication module such as a wireless LAN module, an antenna switch module, and a high frequency circuit module such as a power supply module, the present disclosure is not limited thereto.

First Embodiment of Circuit Module

A first embodiment of a circuit module according to the present disclosure will be described with reference to FIGS. 1A to 3B. Note that the drawings indicate only essential portions, and portions other than the essential portions are not referenced and not illustrated for the sake of simplicity. Likewise, as for the drawings to be used later, only the essential portions will be described.

In the drawings, configurations and forms of the circuit modules and each of the constituent elements are schematically illustrated. In other words, it can be said that the drawings to be used hereinafter practically represent the actual circuit module even if there are some differences in the configuration and form from those of the actual circuit module.

<Structure of Circuit Module>

Figure 1A:
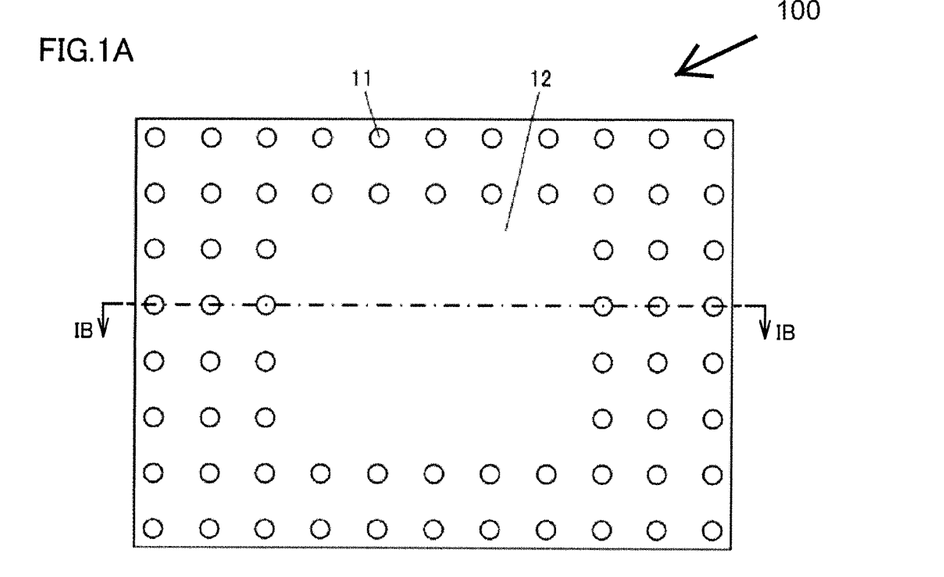
FIG. 1A is an external view (bottom view) of a circuit module 100 as a first embodiment of a circuit module according to the present disclosure.
Figure 1B:
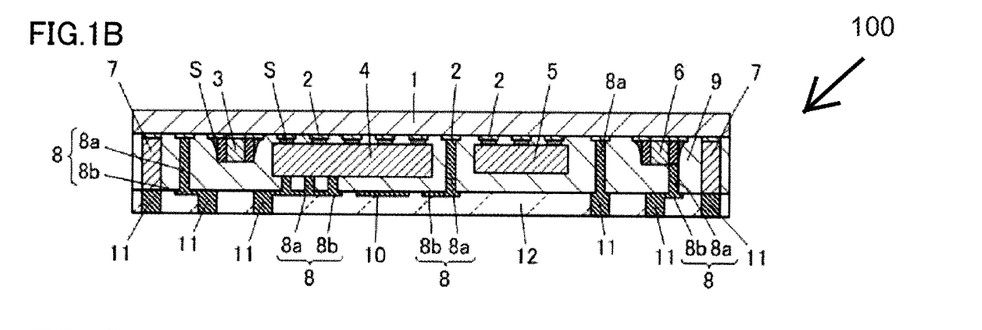
FIG. 1B is a cross-sectional view taken along an arrow line IB-IB in FIG. 1A.
Figure 1C:
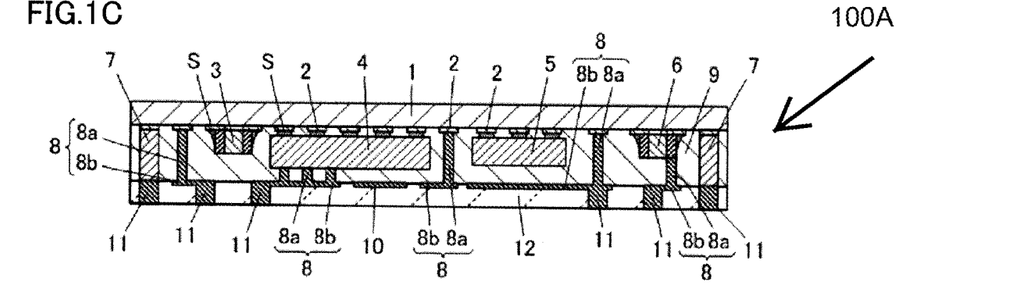
FIG. 1C is a cross-sectional view of a circuit module 100A as a modification of the first embodiment of the circuit module according to the present disclosure.

FIGS. 1A and 1B are drawings illustrating a structure of a circuit module 100 as the first embodiment of the circuit module according to the present disclosure. FIG. 1A is an external view (bottom view) seen from a side of a second resin layer 12 in a normal line direction of one principal surface of a substrate 1. FIG. 1B is a cross-sectional view taken along an arrow line IB-IB in FIG. 1A.

The circuit module 100 according to the present disclosure includes the substrate 1, first electronic components 3 to 6, a metal pin 7, a plurality of connection conductors 8, a first resin layer 9, a wiring conductor 10, a plurality of second columnar conductors 11, and a second resin layer 12.

The substrate 1 is, for example, a ceramic multilayer substrate in which an insulating layer is made of a low-temperature sintered ceramic material. The type of the substrate 1 is not limited to the above one, and may be a so-called glass epoxy substrate or the like in which an insulating layer is made of, for example, a composite material containing a woven or non-woven fabric of glass or the like and an insulative resin such as an epoxy resin. A first wiring pattern 2 is provided on the one principal surface of the substrate 1. The first wiring pattern 2 is formed using a metal material such as Cu. However, the material of the first wiring pattern 2 is arbitrary, and therefore is not limited thereto.

The first electronic components 3 to 6 are electronic components such as multilayer capacitors, multilayer inductors, various types of filters, and various types of ICs. The first electronic components 3 to 6 are connected to the first wiring pattern 2 by using a bonding material S such as Sn—Ag—Cu based Pb-free solder, and constitute a first electronic circuit (not illustrated) together with the first wiring pattern 2.

Each of the plurality of connection conductors 8 connects the first electronic circuit to one of the second columnar conductors 11 serving as external connection terminals. The plurality of connection conductors and the plurality of second columnar conductors 11 are formed using a metal material selected from, for example, Cu, a Cu alloy, Ag, an Ag alloy, and the like.

Likewise, the metal pin 7 also connects the first electronic circuit to the second columnar conductor 11 serving as the external connection terminal. The metal pin 7 is connected to the first wiring pattern 2 by using the bonding material S such as Sn—Ag—Cu based Pb-free solder. In some case, the metal pin 7 is not used depending on the configuration of the circuit module. The metal pin 7 is formed in advance using a metal material similar to the metal material described above. However, the materials of the plurality of connection conductors 8, metal pins 7, and second columnar conductors 11 are arbitrary, and are not limited thereto.

At least one of the plurality of connection conductors 8 includes a first columnar conductor 8a and a plate-like conductor 8b. The first columnar conductor 8a extends in the normal line direction of the one principal surface of the substrate 1. The plate-like conductor 8b extends in a direction parallel to the one principal surface of the substrate 1. The second columnar conductor 11 serves as the external connection terminal, and extends in the normal line direction of the one principal surface of the substrate 1. The circuit module 100 includes the wiring conductor 10 described above. The wiring conductor 10 is disposed on the same plane as the plate-like conductor 8b, and extends to be parallel to the one principal surface of the substrate 1. However, the wiring conductor 10 may not be used depending on the configuration of the circuit module.

One end of the first columnar conductor 8a is connected to the first wiring pattern 2 or to the first electronic components 4 and 6. In the first electronic component 4, the one end of the first columnar conductor 8a is connected to an electronic component base body of the first electronic component 4. In addition, in the first electronic component 6, the one end of the first columnar conductor 8a is connected to the external connection terminal. The other end of the first columnar conductor 8a is connected to the plate-like conductor 8b.

Although not illustrated in FIG. 1B, an area of the one end of the first columnar conductor 8a is wider than an area of the other end thereof, so that the first columnar conductor 8a has a shape like an elongating truncated cone. Further, an area of one end of the second columnar conductor 11 is wider than an area of the other end thereof, so that the second columnar conductor 11 also has a shape like a truncated cone.

In the circuit module 100, the first columnar conductor 8a, the plate-like conductor 8b and the second columnar conductor 11 are made of the same material, and are formed as an integrated member. The first columnar conductor 8a is directly connected to the first wiring pattern 2 or to the first electronic components 4 and 6. Here, the situation in which the first columnar conductor 8a is directly connected to the first wiring pattern 2 or to the first electronic components 4 and 6 means that they are connected to each other without using a bonding material such as solder or a conductive adhesive as described above.

The first electronic components 3 to 6 and the first columnar conductor 8a are embedded in the first resin layer 9. The plate-like conductor 8b and the second columnar conductor 11 are embedded in the second resin layer 12. The first resin layer 9 is disposed on the one principal surface of the substrate 1. The second resin layer 12 is disposed on the first resin layer. The first resin layer 9 and the second resin layer 12 are formed using a resin material in which a glass material, silica, or the like is dispersed as a filler. Note that, however, the first resin layer 9 and the second resin layer 12 may be formed of a resin material alone. The first resin layer 9 and the second resin layer 12 may be formed using either the same resin material or different resin materials.

A cross-sectional area of the first columnar conductor 8a orthogonal to the normal line direction of the one principal surface of the substrate 1 is smaller than a cross-sectional area of the second columnar conductor 11 orthogonal to the normal line direction of the one principal surface of the substrate 1.

In the circuit module 100, the arrangement density of the first electronic components 3 to 6 and the first columnar conductors 8a on the one principal surface of the substrate 1 is high, so that the circuit module 100 is miniaturized. In addition, since the cross-sectional area of the second columnar conductor 11 is larger than that of the first columnar conductor 8a, the connection reliability of the circuit module 100 when connected to a mother substrate of an electronic apparatus is also improved.

In the circuit module 100, in the case where the one end of the second columnar conductor 11 is connected to the plate-like conductor at a position where the first columnar conductor 8a and the second columnar conductor 11 do not share the same axis line, the degree of freedom in layout of the external connection terminal is high. In other words, the layout of the external connection terminal can be freely changed in accordance with the length of the plate-like conductor 8b, the extending direction and the shape thereof, and the connection position of the second columnar conductor 11 with respect to the plate-like conductor 8b.

The plate-like conductor 8b functions as wiring parallel to the one principal surface of the substrate 1 as described above. Further, for example, there may be a case in which the first electronic component 5 is an IC and it is required to block the noise from a mother substrate of an electronic apparatus. In this case, as in a circuit module 100A illustrated in FIG. 1C, which is a modification of the first embodiment, one of the plate-like conductors 8b is so formed as to cover the first electronic component 5 when seen from the normal line direction of the one principal surface of the substrate 1. By doing so, one of the plate-like conductors 8b can function as a shield.

Further, since the first columnar conductor 8a, the plate-like conductor 8b, and the second columnar conductor 11 are formed as an integrated member, they are firmly connected to each other. Then, when the first columnar conductor 8a is connected to the first wiring pattern 2 or the first electronic component 6, the electric resistance from the first wiring pattern 2 or the first electronic component 6 to the second columnar conductor 11 is suppressed to a low level. In addition, in the case where the first electronic component 4 is an electronic component that generates a large amount of heat during the operation like an IC, the first columnar conductor 8a connected to the electronic component base body of the first electronic component 4 functions as a thermal via.

Unlike the case of the circuit module 100 described above, the first columnar conductor 8a, the plate-like conductor 8b, and the second columnar conductor 11 may not be formed as an integrated member using the same material. For example, the plate-like conductor 8b and the second columnar conductor 11 may be formed as an integrated member using the same material. For example, the first columnar conductor 8a having a smaller cross-sectional area and a longer length than the second columnar conductor 11 may be formed using Ag having a lower electric resistivity, and the second columnar conductor 11 may be formed using Cu.

Conversely, the first columnar conductor 8a having a long length may be formed using Cu having high strength in order not to be destroyed by a flow pressure or the like of the resin when the first columnar conductor 8a is embedded in the first resin layer 9, and the second columnar conductor 11 having a short length may be formed using Ag. Further, the first columnar conductor 8a, the plate-like conductor 8b, and the second columnar conductor 11 may be formed of different materials from one another.

In this case, since the plate-like conductor 8b and the second columnar conductor 11 are formed as an integrated member, they are firmly connected to each other so that there is no increase in the electric resistance due to the generation of a boundary surface. Further, the electric resistance related to the first columnar conductor 8a is made smaller.

<Manufacturing Method for Circuit Module>

FIGS. 2A to 2F and FIGS. 3A to 3B illustrate an example of a manufacturing method for the circuit module 100, which is the first embodiment of the circuit module according to the present disclosure. Each of FIGS. 2A to 2F and FIGS. 3A to 3B is a cross-sectional view schematically illustrating an essential portion of each process carried out in sequence in the example of the manufacturing method for the circuit module 100. Each drawing of FIGS. 2A to 2F and FIGS. 3A to 3B corresponds to the cross-sectional view taken along the arrow line IB-IB in FIG. 1A (see FIG. 1B).

Figure 2A:
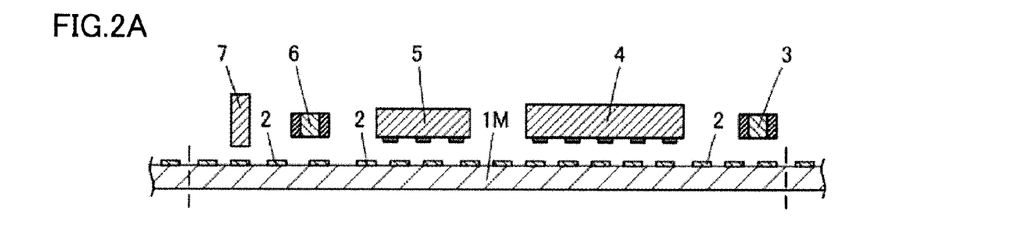
FIG. 2A is a diagram illustrating an example of a manufacturing method for the circuit module 100, and is a first cross-sectional view schematically illustrating part of a manufacturing process.

FIG. 2A is a cross-sectional view illustrating a process (first process) in which the substrate 1 and the electronic components including the first electronic components 3 to 6 are produced or prepared. In the manufacturing method for the circuit module 100, each process is carried out while the substrate 1 is given in a state of having a collective board 1M. Each process may be carried out in the state of having the substrate 1. That is, a cutting process to be described later is not an essential process in the present disclosure. The first wiring pattern 2 is provided on one principal surface of the collective board 1M. Since the circuit module 100 also includes the metal pin 7, the metal pin 7 is also produced or prepared in the first process.

Figure 2B:
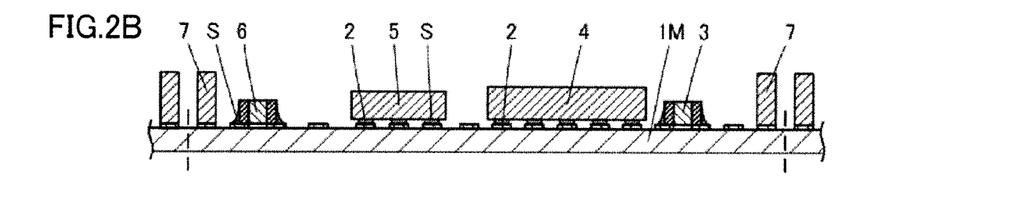
FIG. 2B is a diagram illustrating an example of the manufacturing method for the circuit module 100, and is a second cross-sectional view schematically illustrating part of a manufacturing process.

FIG. 2B is a cross-sectional view illustrating a process (second process) in which the first electronic components 3 to 6 and the metal pin 7 are connected to the first wiring pattern 2 so as to constitute the first electronic circuit (not illustrated) together with the first wiring pattern 2. One end of each of the first electronic components 3 to 6 and one end of the metal pin 7 are connected to the first wiring pattern 2 on the one principal surface of the collective board 1M by using the above-mentioned bonding material S so as to constitute the predetermined first electronic circuit.

Figure 2C:
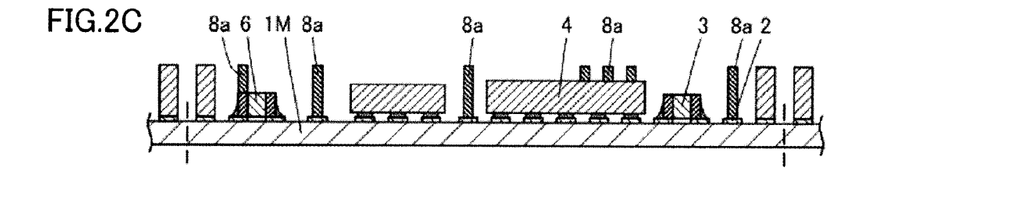
FIG. 2C is a diagram illustrating an example of the manufacturing method for the circuit module 100, and is a third cross-sectional view schematically illustrating part of a manufacturing process.

FIG. 2C illustrates a process (third process) in which the first columnar conductor 8a is formed. The formation of the first columnar conductor 8a is performed by sintering a compact produced by the ink jet method using conductive ink containing Cu nanoparticles, at a temperature of about 150° C., for example. At this time, the first columnar conductor 8a is formed to extend in the normal line direction of the one principal surface of the collective board 1M.

The one end of the first columnar conductor 8a is directly connected to the first wiring pattern 2 or to the first electronic components 4 and 6. Although not illustrated in FIG. 2C, an area of the one end of the first columnar conductor 8a is wider than an area of the other end thereof, so that the first columnar conductor 8a has a shape like an elongating truncated cone. As described above, the material of the first columnar conductor 8a may be a metal material other than Cu.

Figure 2D:
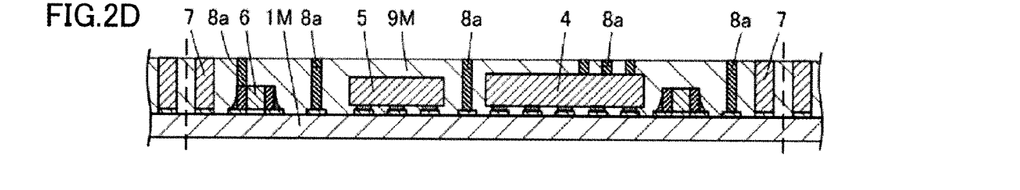
FIG. 2D is a diagram illustrating an example of the manufacturing method for the circuit module 100, and is a fourth cross-sectional view schematically illustrating part of a manufacturing process.

FIG. 2D illustrates a process (fourth process) in which the first wiring pattern 2, the first electronic components 3 to 6, the metal pin 7, and the first columnar conductor 8a are embedded in the first resin layer 9. The fourth process in the manufacturing method for the circuit module 100 is carried out by a first collective resin layer 9M embedding the above constituent elements therein while the substrate 1 is given in the state of the collective board 1M. The first collective resin layer 9M is formed as follows: the above-mentioned resin material is applied on the one principal surface of the collective board 1M, and is cured thereon.

At this time, the other end of the first columnar conductor 8a and the other end of the metal pin 7 are exposed from a surface of the first collective resin layer 9M. The other end of the first columnar conductor 8a and the other end of the metal pin 7 may be exposed by the first collective resin layer 9M being formed on the one principal surface of the collective board 1M with a layer thickness adjusted to the height position of the other ends thereof. In addition, after the first collective resin layer 9M is formed on the one principal surface of the collective board 1M to the extent that the other ends thereof are covered, the first collective resin layer 9M may be polished to make the stated other ends exposed.

Figure 2E:
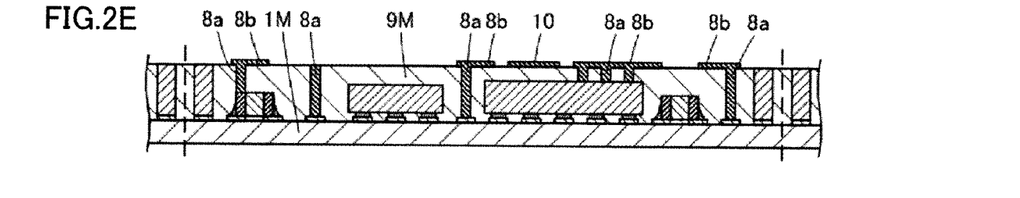
FIG. 2E is a diagram illustrating an example of the manufacturing method for the circuit module 100, and is a fifth cross-sectional view schematically illustrating part of a manufacturing process.

FIG. 2E illustrates a process (fifth process) in which the plate-like conductor 8b is formed on the surface of the first collective resin layer 9M. The formation of the plate-like conductor 8b is performed by firing a compact produced by the ink jet method using conductive ink containing Cu nanoparticles. At this time, the plate-like conductor 8b is formed to extend in a direction parallel to the one principal surface of the collective board 1M. Further, the plate-like conductor 8b is connected to the other end of the first columnar conductor 8a.

The plate-like conductor 8b may be formed by screen printing or mask printing of a conductive paste containing Cu nanoparticles, for example. As described above, the material of the plate-like conductor 8b may be a metal material other than Cu.

Figure 2F:
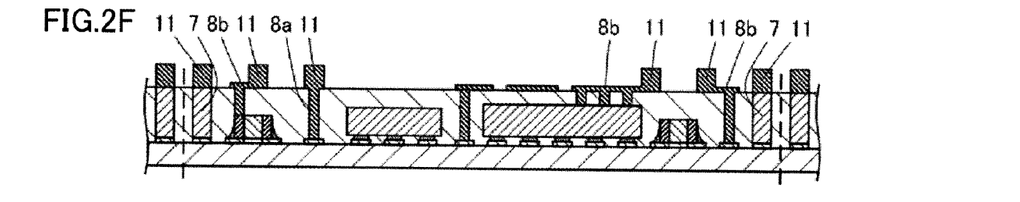
FIG. 2F is a diagram illustrating an example of the manufacturing method for the circuit module 100, and is a sixth cross-sectional view schematically illustrating part of a manufacturing process.

FIG. 2F illustrates a process (sixth process) in which the second columnar conductor 11 is formed. The second columnar conductor 11 is formed by firing a compact produced by the ink jet method using conductive ink containing Cu nanoparticles. Although not illustrated in FIG. 2F, an area of the one end of the second columnar conductor 11 is wider than an area of the other end thereof, so that the second columnar conductor 11 also has a shape like an elongating truncated cone.

The second columnar conductor 11 may be formed by screen printing or mask printing of a conductive paste containing Cu nanoparticles, for example. As described above, the material of the plate-like conductor 8b may be a metal material other than Cu.

Figure 3A:
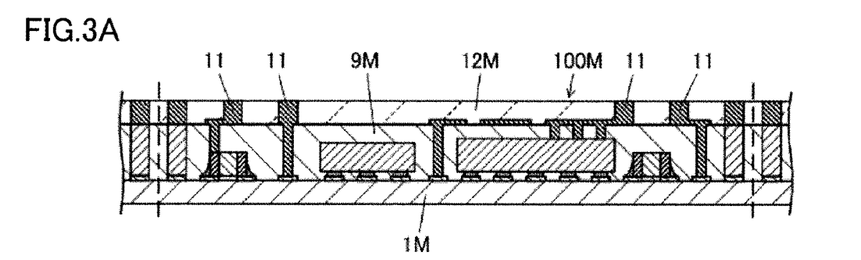
FIG. 3A is a diagram illustrating an example of the manufacturing method for the circuit module 100, and is a seventh cross-sectional view schematically illustrating part of a manufacturing process.

FIG. 3A illustrates a process (seventh process) in which the plate-like conductor 8b and the second columnar conductor 11 are embedded in the second resin layer 12. The seventh process in the manufacturing method for the circuit module 100 is carried out by a second collective resin layer 12M embedding the above constituent elements therein while the substrate 1 is given in the state of the collective board 1M. The second collective resin layer 12M is formed as follows: the above-mentioned resin material is applied on the surface of the first collective resin layer 9M, and is cured thereon. At this time, the other end of the second columnar conductor 11 is exposed from the surface of the second collective resin layer 12M. The method of exposing the other end of the second columnar conductor 11 is the same as that of the fourth process.

In the manufacturing method for the circuit module 100, an aggregate 100M of the circuit modules 100 is manufactured by carrying out the above processes including this process. In a case where each process is carried out in the state of having the substrate 1, the circuit module 100 is completed by carrying out the above processes including this process. That is, the cutting process to be described later will not be carried out.

Figure 3B:
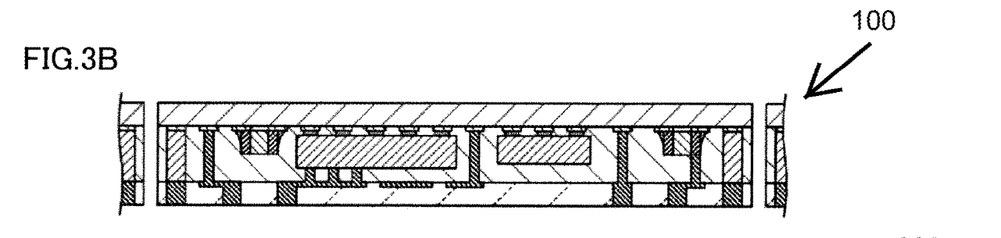
FIG. 3B is a diagram illustrating an example of the manufacturing method for the circuit module 100, and is an eighth cross-sectional view schematically illustrating part of a manufacturing process.

FIG. 3B illustrates a process (cutting process) in which the aggregate 100M of the circuit modules 100 is cut and singulated into the individual circuit modules 100. The aggregate 100M is cut by using, for example, a dicing saw. In the manufacturing method for the circuit module 100, the circuit module 100 is completed by carrying out the above processes including this process.

In the manufacturing method for the circuit module 100, the first columnar conductor 8a having a cross-sectional area smaller than that of the second columnar conductor 11 is formed by the ink jet method. Accordingly, the arrangement density and the arrangement accuracy of the first electronic components 3 to 6 and the first columnar conductor 8a on the one principal surface of the substrate 1 can be enhanced. This makes it possible to miniaturize the circuit module 100.

Second Embodiment of Circuit Module

A second embodiment of a circuit module according to the present disclosure will be described with reference to FIGS. 4A to 4B and FIGS. 5A to 5D.

<Structure of Circuit Module>

Figure 4A:
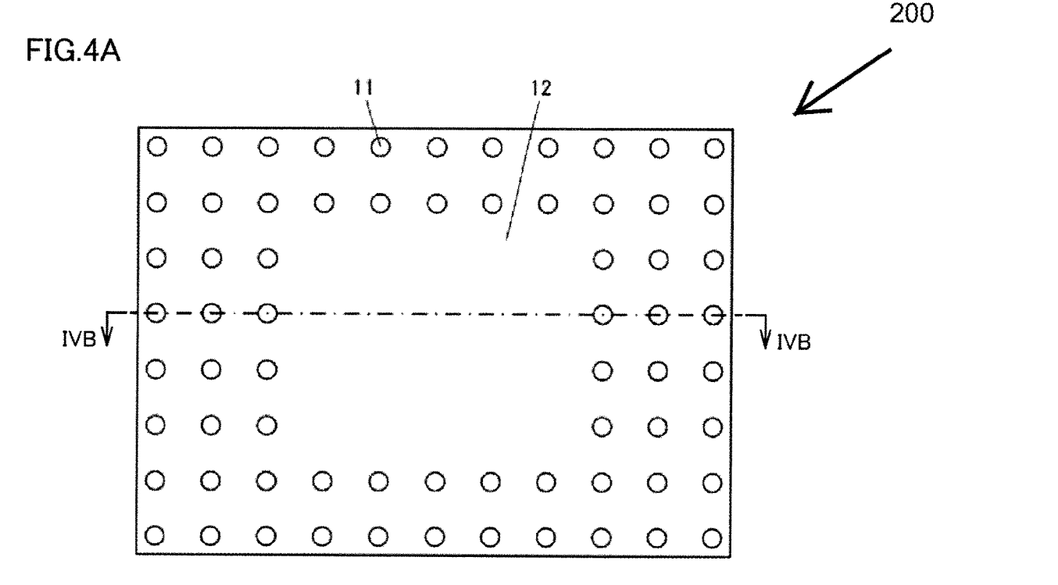
FIG. 4A is an external view (bottom view) of a circuit module 200 as a second embodiment of a circuit module according to the present disclosure, when seen from a side of a second resin layer 12 in a normal line direction of one principal surface of a substrate 1.
Figure 4B:
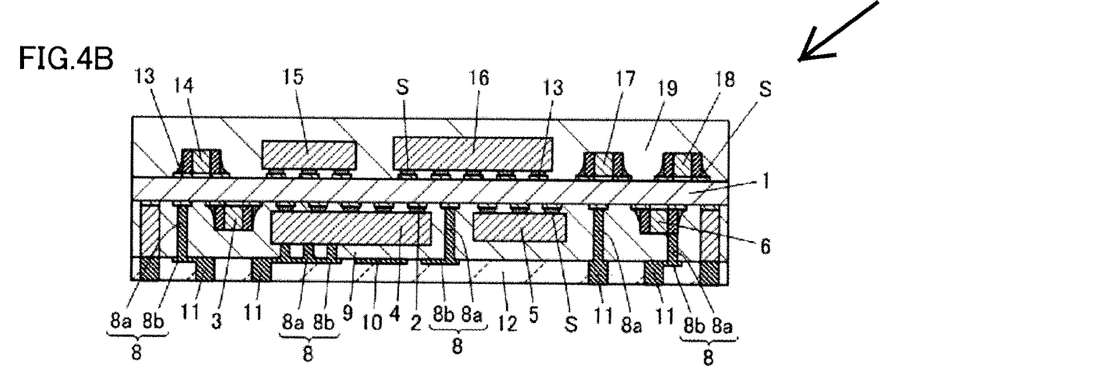
FIG. 4B is a cross-sectional view taken along an arrow line IVB-IVB in FIG. 4A.

FIGS. 4A and 4B illustrate a structure of a circuit module 200, which is a second embodiment of the circuit module according to the present disclosure. FIG. 4A is an external view (bottom view) seen from a side of a second resin layer 12 in a normal line direction of one principal surface of a substrate 1. FIG. 4B is a cross-sectional view taken along an arrow line IVB-IVB in FIG. 4A.

The circuit module 200 is different from the circuit module 100 described above in that a second electronic circuit is constituted on the other principal surface side of the substrate 1, and constituent elements related to the second electronic circuit are embedded in a third resin layer. Since other constituent components are the same as those of the circuit module 100, further description thereof will be omitted herein.

The circuit module 200 according to the present disclosure includes second electronic components 14 to 18 and a third resin layer 19, in addition to the constituent elements of the circuit module 100 described above.

As described above, the substrate 1 is made of a ceramic multilayer substrate, a glass epoxy substrate, or the like. A first wiring pattern 2 is provided on the one principal surface of the substrate 1, and a second wiring pattern 13 is provided on the other principal surface thereof. Similar to the first wiring pattern 2, the second wiring pattern 13 is formed using a metal material such as Cu. However, the material of the second wiring pattern 13 is arbitrary, and therefore is not limited thereto.

Similar to first electronic components 3 to 6, the second electronic components 14 to 18 are also electronic components such as multilayer capacitors, multilayer inductors, various types of filters, and various types of ICs. The second electronic components 14 to 18 are connected to the second wiring pattern 13 by using a bonding material S such as Sn—Ag—Cu based Pb-free solder, so as to constitute a second electronic circuit (not illustrated) together with the second wiring pattern 13.

The second electronic components 14 to 18 are embedded in the third resin layer 19. The third resin layer 19 is disposed on the other principal surface of the substrate 1. Similar to a first resin layer 9 and a second resin layer 12, the third resin layer 19 is formed using a resin material in which a glass material, silica, or the like is dispersed as a filler. Note that, however, the third resin layer 19 may be formed of a resin material alone. The first resin layer 9, the second resin layer 12, and the third resin layer may be formed using either the same resin material or different resin materials.

In the circuit module 200, the second electronic circuit is constituted on the other principal surface side of the substrate 1, so that higher performance is achieved.

<Manufacturing Method for Circuit Module>

FIGS. 5A to 5D illustrate an example of a manufacturing method for the circuit module 200, which is the second embodiment of the circuit module according to the present disclosure. Each of FIGS. 5A to 5D is a cross-sectional view schematically illustrating a process different from that of the manufacturing method for the circuit module 100, in an essential portion of each process carried out in sequence in an example of the manufacturing method for the circuit module 200. Since other processes are the same as those of the manufacturing method for the circuit module 100, further description thereof will be omitted herein.

Each drawing of FIGS. 5A to 5D corresponds to the cross-sectional view taken along the arrow line IVB-IVB in FIG. 4A (see FIG. 4B).

Figure 5A:
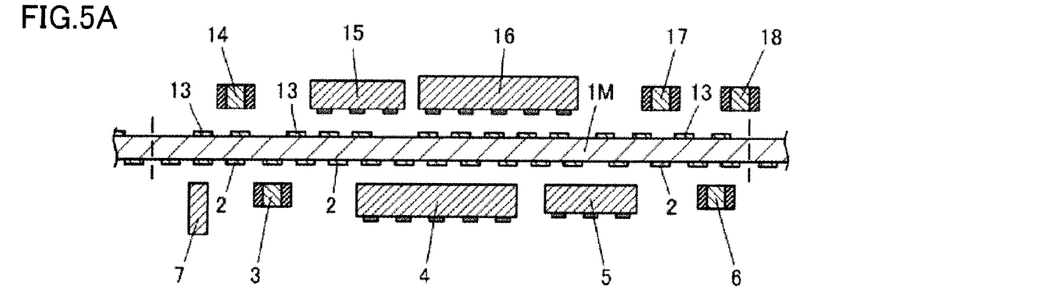
FIG. 5A is a first cross-sectional view illustrating part of a process of an example of a manufacturing method for a circuit module 200.

FIG. 5A is a cross-sectional view illustrating a process (first process) in which the substrate 1, the first electronic components 3 to 6, a metal pin 7, and the electronic components including the second electronic components 14 to 18 are produced or prepared. In the manufacturing method for the circuit module 200, similar to the manufacturing method for the circuit module 100, each process is carried out while the substrate 1 is given in a state of having a collective board 1M. Each process may also be carried out in the state of having the substrate 1, similar to the manufacturing method for the circuit module 100. The first wiring pattern 2 is provided on one principal surface of the collective board 1M, and the second wiring pattern 13 is provided on the other principal surface thereof.

Figure 5B:
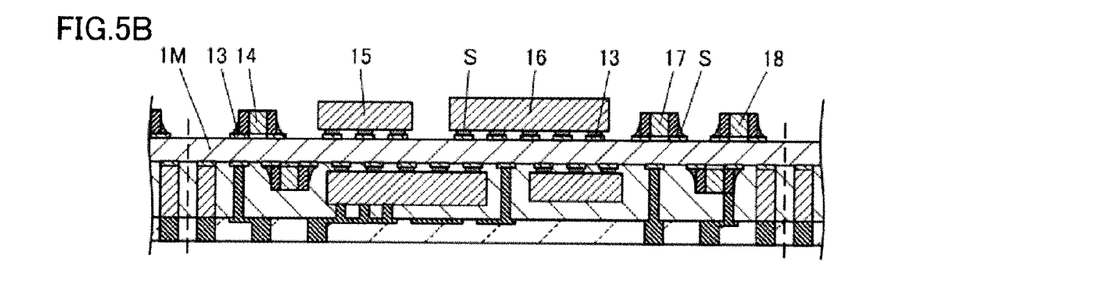
FIG. 5B is a second cross-sectional view illustrating part of a process of an example of the manufacturing method for the circuit module 200.

FIG. 5B is a cross-sectional view illustrating a process (eighth process) in which the second electronic components 14 to 18 are connected to the second wiring pattern 13 so as to constitute the second electronic circuit (not illustrated) together with the second wiring pattern 13. One end of each of the second electronic components 14 to 18 is connected to the second wiring pattern 13 on the other principal surface of the collective board 1M by using the above-mentioned bonding material S so as to constitute the predetermined second electronic circuit.

Figure 5C:
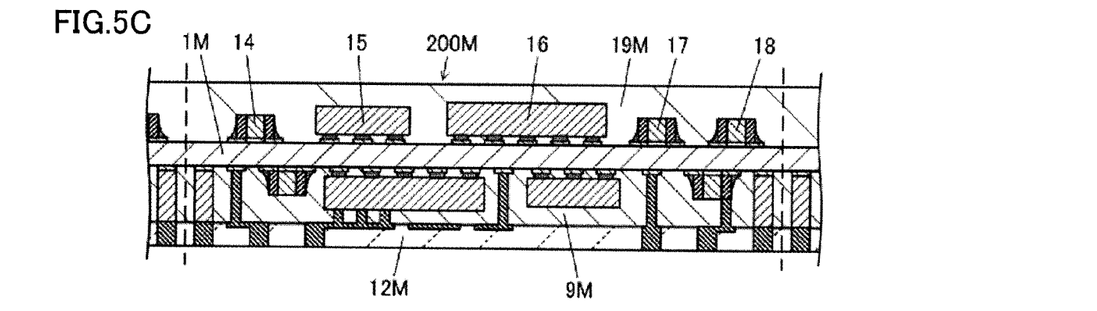
FIG. 5C is a third cross-sectional view illustrating part of a process of an example of the manufacturing method for the circuit module 200.

FIG. 5C illustrates a process (ninth process) in which the second wiring pattern 13 and the second electronic components 14 to 18 are embedded in the third resin layer 19. The ninth process in the manufacturing method for the circuit module 200 is carried out by a third collective resin layer 19M embedding the above constituent elements therein while the substrate 1 is given in the state of having the collective board 1M. The third collective resin layer 19M is formed as follows: the above-mentioned resin material is applied on the other principal surface of the collective board 1M, and is cured thereon.

In the manufacturing method for the circuit module 200, an aggregate 200M of the circuit modules 200 is manufactured by carrying out the above processes including this process. In a case where each process is carried out in the state of having the substrate 1, the circuit module 200 is completed by carrying out the above-discussed processes including this process. That is, the cutting process to be described later will not be carried out.

Figure 5D:
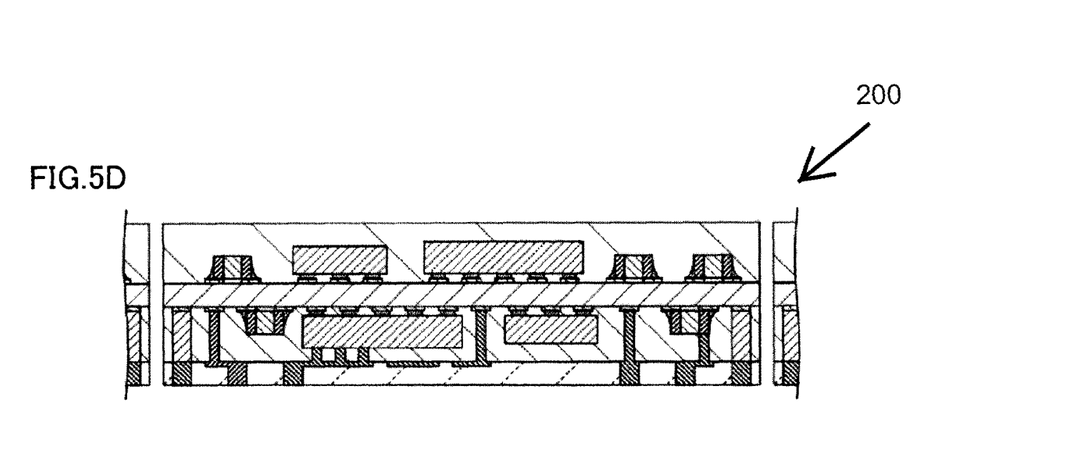
FIG. 5D is a fourth cross-sectional view illustrating part of a process of an example of the manufacturing method for the circuit module 200.

FIG. 5D illustrates a process (cutting process) in which the aggregate 200M of the circuit modules 200 is cut and singulated into the individual circuit modules 200. The aggregate 200M is cut by using, for example, a dicing saw. In the manufacturing method for the circuit module 200, the circuit module 200 is completed by carrying out the above processes including this process.

In the manufacturing method for the circuit module 200, the second electronic circuit is constituted on the other principal surface side of the substrate 1, thereby making it possible to manufacture the circuit module 200 having higher performance.

The present disclosure is not intended to limit to the above embodiments, and various applications and modifications can be made within the scope of the present disclosure. It should also be noted that the embodiments described in this specification are exemplary, and partial substitutions or combinations of the configurations can be made between different embodiments.

It should be noted that the above-described embodiments are illustrative in all respects and are not restrictive. The scope of the present disclosure is defined by the appended claims, and is intended to cover any meanings equivalent to the appended claims and all modifications within the scope of the disclosure.

1 SUBSTRATE
2 FIRST WIRING PATTERN
3-6 FIRST ELECTRONIC COMPONENT
7 METAL PIN
8 CONNECTION CONDUCTOR
8a FIRST COLUMNAR CONDUCTOR
8b PLATE-LIKE CONDUCTOR
9 FIRST RESIN LAYER
10 WIRING CONDUCTOR
11 SECOND COLUMNAR CONDUCTOR
12 SECOND RESIN LAYER
13 SECOND WIRING PATTERN
14-18 SECOND ELECTRONIC COMPONENT
19 THIRD RESIN LAYER
100, 200 CIRCUIT MODULE
S BONDING MATERIAL

The invention claimed is:
1. A circuit module comprising:
a substrate;
an electronic component;
a plurality of connection conductors;
a plurality of external connection terminals; and
a resin layer,
wherein a first wiring pattern is provided on one principal surface of the substrate,
the electronic component includes a first electronic component connected to the first wiring pattern to constitute a first electronic circuit together with the first wiring pattern,
each of the plurality of connection conductors connects the first electronic circuit to one of the plurality of external connection terminals,
each of the plurality of connection conductors includes a first columnar conductor extending in a normal line direction of the one principal surface of the substrate, and at least one of the plurality of connection conductors includes a plate conductor extending in a direction parallel to the one principal surface of the substrate,
one end of at least one of the first columnar conductors is connected to the first wiring pattern or the first elec- tronic component, and another end of at least one of the first columnar conductors is connected to the plate conductor, at least one of the plurality of external connection terminals is a second columnar conductor extending in the normal line direction of the one principal surface of the substrate, the resin layer includes a first resin layer disposed on the one principal surface of the substrate, and a second resin layer disposed on the first resin layer, the first electronic component and the first columnar conductor are embedded in the first resin layer, and the plate conductor and the second columnar conductor are embedded in a single layer of the second resin layer, a cross-sectional area of the first columnar conductor orthogonal to the normal line direction of the one principal surface of the substrate is smaller than a cross-sectional area of the second columnar conductor orthogonal to the normal line direction of the one principal surface of the substrate, and wherein the one end of at least one of the first columnar conductors is directly connected to the first electronic component, and a surface of the first electronic component to which the at least one of the first columnar conductors is connected is opposite to a surface of the first electronic component to which the first wiring pattern is connected.

2. The circuit module according to claim 1,
wherein the plate conductor and the second columnar conductor comprise the same material and are an integrated member.

3. The circuit module according to claim 2,
wherein the first columnar conductor, the plate conductor and the second columnar conductor comprise the same material, and are an integrated member, and
the first columnar conductor is directly connected to the first wiring pattern or the first electronic component.

4. The circuit module according to claim 1,
wherein a second wiring pattern is further provided on another principal surface of the substrate,
the electronic component further includes a second electronic component connected to the second wiring pattern to constitute a second electronic circuit together with the second wiring pattern,
the resin layer further includes a third resin layer disposed on the other principal surface of the substrate, and
the second electronic component is embedded in the third resin layer.

5. A manufacturing method for a circuit module which includes a substrate, an electronic component, a plurality of connection conductors, a plurality of external connection terminals and a resin layer, wherein
a first wiring pattern is provided on one principal surface of the substrate,
the electronic component includes a first electronic component,
at least one of the plurality of connection conductors includes a first columnar conductor extending in a normal line direction of the one principal surface of the substrate, and a plate conductor extending in a direction parallel to the one principal surface of the substrate,
at least one of the plurality of external connection terminals is a second columnar conductor extending in the normal line direction of the one principal surface of the substrate,
a cross-sectional area of the first columnar conductor orthogonal to the normal line direction of the one principal surface of the substrate is smaller than a cross-sectional area of the second columnar conductor orthogonal to the normal line direction of the one principal surface of the substrate, and the resin layer includes a first resin layer and a second resin layer, the method comprising:

a first process of preparing or producing the substrate and the electronic component including the first electronic component;

a second process of connecting the first electronic component to the first wiring pattern to constitute a first electronic circuit together with the first wiring pattern;

a third process of forming the first columnar conductor by sintering a compact produced by an ink jet method using conductive ink containing metal nanoparticles in such a manner that one end of the first columnar conductor is directly connected to the first wiring pattern or the first electronic component;

a fourth process of forming the first resin layer on the one principal surface of the substrate, and embedding the first wiring pattern, the first electronic component and the first columnar conductor in the first resin layer in such a manner that another end of the first columnar conductor is exposed from a surface of the first resin layer;

a fifth process of forming the plate conductor on the surface of the first resin layer by sintering a compact produced by the ink jet method using conductive ink containing metal nanoparticles in such a manner that the plate conductor is connected to the other end of the first columnar conductor;

a sixth process of forming the second columnar conductor by sintering a compact produced by the ink jet method using conductive ink containing metal nanoparticles; and a seventh process of forming the second resin layer on the surface of the first resin layer, and embedding the plate conductor and the second columnar conductor in a single layer of the second resin layer in such a manner that one end of the second columnar conductor is exposed from a surface of the second resin layer, wherein when the one end of the first columnar conductor is connected to the first electronic component, the one end of the first columnar conductor is directly connected to the first electronic component, and a surface of the first electronic component to which the first columnar conductor is connected is opposite to a surface of the first electronic component to which the first wiring pattern is connected.

6. The manufacturing method for the circuit module according to claim 5,
wherein a second wiring pattern is further provided on the other principal surface of the substrate,
the electronic component further includes a second electronic component,
the resin layer further includes a third resin layer disposed on the other principal surface of the substrate, and
in the first process, the second electronic component is further prepared or produced,
the method further comprises an eighth process of connecting the second electronic component to the second wiring pattern to constitute a second electronic circuit together with the second wiring pattern, and
the method further comprises a ninth process of forming the third resin layer on the other principal surface of the substrate, and embedding the second wiring pattern and the second electronic component in the third resin layer.

7. The circuit module according to claim 2,
wherein a second wiring pattern is further provided on another principal surface of the substrate,
the electronic component further includes a second electronic component connected to the second wiring pattern to constitute a second electronic circuit together with the second wiring pattern,
the resin layer further includes a third resin layer disposed on the other principal surface of the substrate, and
the second electronic component is embedded in the third resin layer.

8. The circuit module according to claim 3,
wherein a second wiring pattern is further provided on another principal surface of the substrate,
the electronic component further includes a second electronic component connected to the second wiring pattern to constitute a second electronic circuit together with the second wiring pattern,
the resin layer further includes a third resin layer disposed on the other principal surface of the substrate, and
the second electronic component is embedded in the third resin layer.

9. The circuit module according to claim 1,
wherein an entire portion of the first columnar conductor is embedded in the first resin layer, and entire portions of the plate conductor and the second columnar conductor are embedded in the second resin layer.

10. A circuit module comprising:
a substrate;
an electronic component;
a plurality of connection conductors;
a plurality of external connection terminals; and
a resin layer,
wherein a first wiring pattern is provided on one principal surface of the substrate,
the electronic component includes a first electronic component connected to the first wiring pattern to constitute a first electronic circuit together with the first wiring pattern,
each of the plurality of connection conductors connects the first electronic circuit to one of the plurality of external connection terminals,
at least one of the plurality of connection conductors includes a first columnar conductor extending in a normal line direction of the one principal surface of the substrate, and a plate conductor extending in a direction parallel to the one principal surface of the substrate,
one end of the first columnar conductor is connected to the first wiring pattern or the first electronic component, and another end of the first columnar conductor is connected to the plate conductor,
at least one of the plurality of external connection terminals is a second columnar conductor extending in the normal line direction of the one principal surface of the substrate,
the resin layer includes a first resin layer disposed on the one principal surface of the substrate, and a second resin layer disposed on the first resin layer,
the first electronic component and the first columnar conductor are embedded in the first resin layer, and the plate conductor and the second columnar conductor are embedded in the second resin layer,
a cross-sectional area of the first columnar conductor orthogonal to the normal line direction of the one principal surface of the substrate is smaller than a cross-sectional area of the second columnar conductor orthogonal to the normal line direction of the one principal surface of the substrate, and
wherein when the one end of the first columnar conductor is connected to the first electronic component, the one end of the first columnar conductor is directly connected to the first electronic component, and a surface of the first electronic component to which the first columnar conductor is connected is opposite to a surface of the first electronic component to which the first wiring pattern is connected.

11. The circuit module according to claim 1,
wherein another end of at least one of the first columnar conductors is directly connected to the second columnar conductor without the plate conductor therebetween.

* * * * *

UNITED STATES PATENT AND TRADEMARK OFFICE
CERTIFICATE OF CORRECTION

Page 1 of 1

PATENT NO. : 11,419,211 B2
APPLICATION NO. : 16/537700
DATED : August 16, 2022
INVENTOR(S) : Kazushige Sato et al.

It is certified that error appears in the above-identified patent and that said Letters Patent is hereby corrected as shown below:

On the Title Page

Item (63), -- Continuation of application No. PCT/JP2017/045889 filed on Dec. 21, 2017 -- should be added.

Signed and Sealed this
Ninth Day of July, 2024

Katherine Kelly Vidal
*Director of the United States Patent and Trademark Office*